United States Patent
Sikdar

(10) Patent No.: US 8,266,471 B2
(45) Date of Patent: Sep. 11, 2012

(54) MEMORY DEVICE INCLUDING A MEMORY BLOCK HAVING A FIXED LATENCY DATA OUTPUT

(75) Inventor: Dipak K. Sikdar, Santa Clara, CA (US)

(73) Assignee: MoSys, Inc., Santa Clara, CA (US)

( * ) Notice: Subject to any disclaimer, the term of this patent is extended or adjusted under 35 U.S.C. 154(b) by 332 days.

(21) Appl. No.: 12/702,767

(22) Filed: Feb. 9, 2010

(65) Prior Publication Data

US 2011/0197087 A1   Aug. 11, 2011

(51) Int. Cl.
*G06F 1/04* (2006.01)
(52) U.S. Cl. .................. 713/600; 365/233.1
(58) Field of Classification Search .............. 713/600, 713/501; 365/233.1
See application file for complete search history.

(56) References Cited

U.S. PATENT DOCUMENTS

| | | | |
|---|---|---|---|
| 5,544,124 A | | 8/1996 | Zagar |
| 6,789,210 B2 * | | 9/2004 | Satoh et al. ............ 713/501 |
| 7,042,777 B2 * | | 5/2006 | Oh ......................... 365/194 |
| 7,493,461 B1 * | | 2/2009 | Thorne ..................... 711/167 |
| 7,729,182 B2 * | | 6/2010 | Bringivijayaraghavan et al. ..................... 365/189.16 |
| 7,848,178 B2 * | | 12/2010 | Kim et al. ................ 365/233.1 |
| 2006/0140044 A1 | | 6/2006 | Kang |
| 2007/0019481 A1 | | 1/2007 | Park |
| 2008/0232179 A1 | | 9/2008 | Kwak |
| 2010/0182856 A1 | | 7/2010 | Koshizuka |

FOREIGN PATENT DOCUMENTS

KR    10-2008-0074361    8/2008

OTHER PUBLICATIONS

International Search Report and Written Opinion in application No. PCT/US2011/023997 issued Aug. 31, 2011.

* cited by examiner

*Primary Examiner* — Chun Cao
(74) *Attorney, Agent, or Firm* — Meyertons, Hood, Kivlin, Kowert & Goetzel, P.C.

(57) ABSTRACT

A memory block includes a memory circuit and a clock generation unit. The memory circuit may output read data in response to being clocked by a clock signal having a selectable delay that may be dependent upon a time taken for the read data to be output by a memory core after the read command is received at the memory block. The clock generation unit may cause the read data to be provided as an output of the memory block in response to being clocked by a selected data clock signal. The data clock signal may be selected from one of several clock edges generated by one of several clock edges of a system clock such that regardless of the frequency of the system clock, the read data is provided by the memory block a predetermined amount of time after the read command is received at the memory block.

21 Claims, 7 Drawing Sheets

MEMORY DEVICE INCLUDING A MEMORY BLOCK HAVING A FIXED LATENCY DATA OUTPUT

BACKGROUND

1. Technical Field

This disclosure relates to memory systems and more specifically to pipelined memory circuits.

2. Description of the Related Art

Most computer systems invariably use some form of random access memory (RAM). Often in volatile memory applications a memory device in the dynamic RAM (DRAM) family is used due to cost considerations. Like any memory, DRAM has an inherent amount of time that it takes for data to appear at the DRAM output after a read command has been received at the DRAM input. This is typically referred to as the read latency or the access time. To mitigate some of this read latency, one type of DRAM, known as synchronous DRAM, is implemented using a pipelined architecture in which read latency stretches over multiple cycles but new commands are issued every cycle. Using this technique, the effective data output bandwidth of the device may be increased, which corresponds to a reduced read cycle time. When a pipelined architecture is used, the phrase read cycle time is typically used to refer to the time or the period between successive read data output cycles.

Many conventional pipelined memory devices employ a number of sequential logic clocked storage devices such as latches, flip-flops, and the like in the read address path and the data output clock path. These sequential logic devices may be clocked by the system clock or some derivative thereof. Accordingly, for a given system clock frequency, the memory device will have a corresponding cycle time. However, as the system clock frequency varies, the memory cycle time will be vary. This differing read cycle time can be problematic when attempting to maintain relatively constant latency for various clock frequencies.

SUMMARY

Various embodiments of a memory device including memory block having a fixed latency read data output are disclosed. In one embodiment, the memory block includes a memory circuit and an output clock unit. The memory circuit includes a memory core configured to output read data in response to receiving a read command. The memory circuit may be further configured to output the read data from the memory core in response to being clocked by a clock signal having a selectable delay. The delay may be dependent upon a time taken for the read data to be output by the memory core after the read command is received at the memory block. The output clock unit may be configured to capture the read data from the memory circuit and to cause the read data to be provided as an output of the memory block in response to being clocked by a selected version of a data clock signal. The selected version of the data clock signal may be selected from one of a plurality of clock edges generated by one of a plurality of clock edges of a system clock such that regardless of the operating frequency of the system clock, the read data is provided as the output of the memory block a predetermined amount of time after the read command is received at the memory block.

Figure 1:
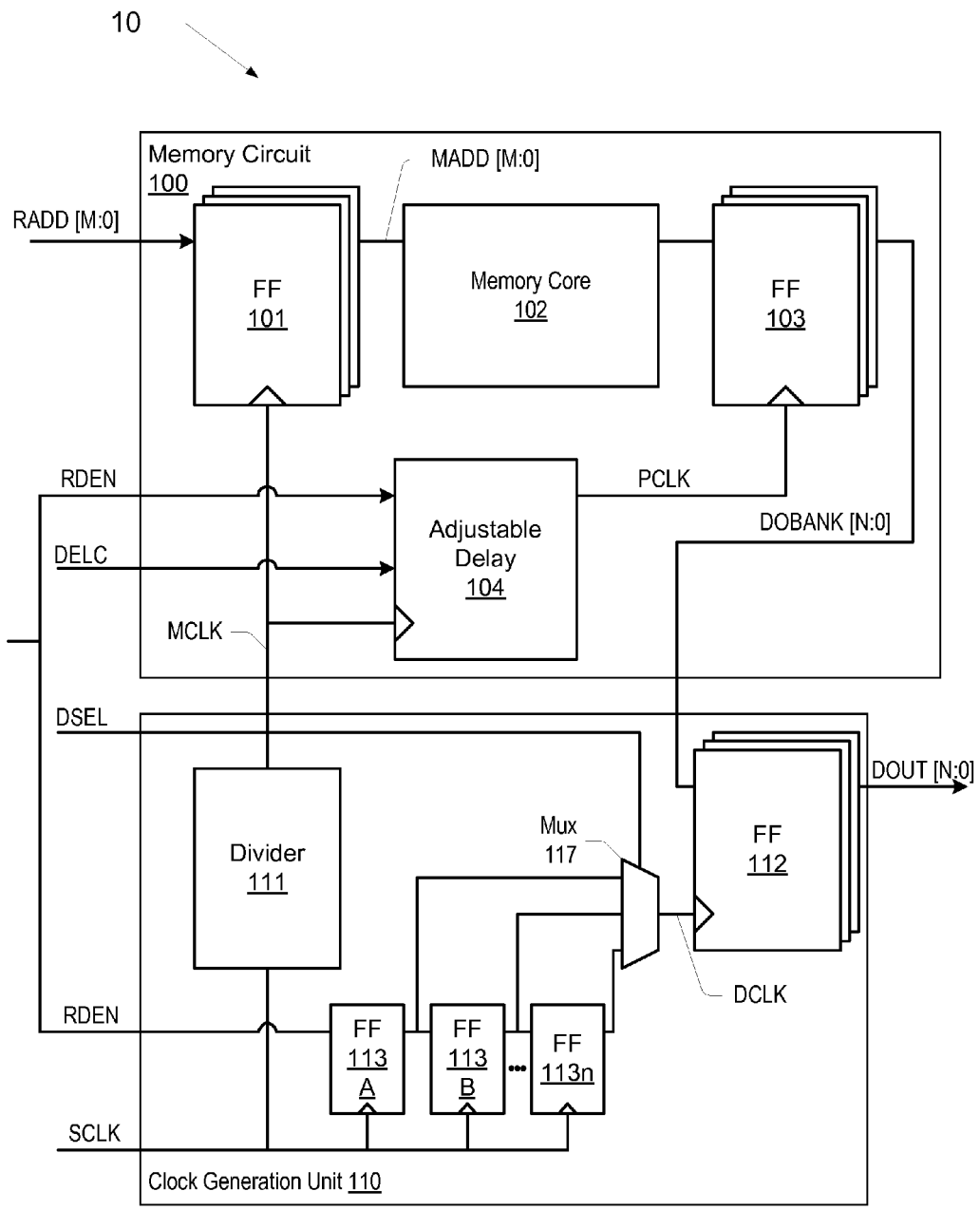
FIG. 1 is a block diagram of one embodiment of a memory block having a fixed latency data output.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

DETAILED DESCRIPTION

Turning now to FIG. 1, a block diagram of one embodiment of a memory block is shown. The memory block 10 includes a memory circuit 100 coupled to a clock generation unit 110. The memory circuit 100 includes a flip-flop (FF) 101 coupled to an input of a memory core 102. The output of memory core 102 is coupled to FF 103. As shown, the input of FF 101 is coupled to receive a read and address input command (RADD [M:0]), and is clocked by the memory clock signal (MCLK). The memory circuit also includes an adjustable delay unit 104 which is coupled to receive the read enable signal (RDEN). The adjustable delay 104 is also clocked by the MCLK signal and produces a pipeline clock signal (PCLK), which is used to clock the FF 103. It is noted that the RADD [M:0] signal corresponds to a multi-signal path that includes M+1 signal paths. Accordingly, the depiction of FF 101 is a multi-flip-flop implementation in which there may be an FF 101 for each signal path.

In the illustrated embodiment, the clock generation unit 110 includes a divider 111 that is coupled to receive a system clock signal (SCLK) input and to provide the MCLK signal output (which may be, in one embodiment, a frequency multiple of SCLK that is less than 1) to the memory circuit 100. The clock generation unit 110 also includes a chain of flip-flops (e.g., FF 113A, 113B, and 113n), each clocked by the SCLK signal. The input of the FF chain is coupled to receive the RDEN signal. Each output of the FF chain is coupled to a respective input of the multiplexer (mux) 117. The mux 117 select input is coupled to a DSEL signal, which may be a multi-bit signal. The output of mux 117 is coupled to the clock input of FF 112. The input of FF 112 is coupled to receive the output of FF 103 designated as the DOBANK [N:0] signal. The timing of the above signals at different SCLK frequencies is illustrated in FIG. 2A through FIG. 2D and described further below. It is noted that although there are only three FF devices (e.g., 113A, 113B, and 113n) in the FF chain in FIG. 1, it is contemplated that there may be n FF devices in the FF chain, where n may be any positive whole number. Is also noted that similar to the RADD [M:0] signal being a multi-signal path, the DOBANK [N:0]signal and the DOUT [N:0] signal are each representative of a multi-bit datapaths including N+1 data paths. Thus, FF 103 and FF 112 are multi-flip-flop implementations in which there may be an FF 103 and FF 112 for each datapath.

In one embodiment, read addresses and read commands are received by the memory circuit 100 via the RADD [M:0] signal at the input of FF 101. As FF 101 is clocked by the MCLK signal, the RADD [M:0] signal is captured (i.e., temporarily stored) by FF 101, and is provided to memory core 102 as the MADD [M:0] signal where the read operation begins to propagate through the memory core. At some time later, the read data appears at the output of memory core 102 and is applied to the input of FF 103. Meanwhile some number of additional read operations may be concurrently in progress (e.g., one for each cycle of MCLK) within memory core 102 so that memory core 102 may provide read data at the input of FF 103 (e.g. at the MCLK frequency). Accordingly, for FF 103 to capture each read data output from memory core 102, the PCLK signal must clock FF 103 at the appropriate time. As FF 103 is clocked by PCLK, the read data appears at the output of FF 103 as the DOBANK [N:0] signal.

However, due to a variety of factors the read cycle period may vary. For example, due to process variations and operating voltage and temperature variations, the memory timing can vary. To accommodate a possibly varying read data output window, adjustable delay unit 104 may be configured to adjust the PCLK phase to accurately clock the FF 103 to capture the read data output from the memory core 102. In one embodiment, the memory core 102 may be a memory array having any number of memory cells and may be characterized during various manufacturing stages such as during first silicon testing to obtain optimum read cycle timing across process, voltage and temperature corners. In one embodiment, adjustable delay unit 104 may include a number of selectable delay stages that may be selected using the DELC signal. The DELC signal may be a multi-bit signal provided by a memory controller (shown in FIG. 4). Alternatively, the DELC signal may be provided by hardwired signals or jumpers on a system board, for example. In another embodiment, delay signals corresponding to the DELC signals may be provided to the memory controller, which may then provide the DELC signals to the adjustable delay unit 104. When the DELC signals are provided by a memory controller, these values may be changed dynamically during operation in some embodiments. For example, in one embodiment, a built-in self-test (BIST) routine may indicate that the timing is not accurate, and the memory controller may change the DELC signals to modify the PCLK timing until the BIST passes.

Although the PCLK signal is adjustable to account for variations in the memory core read data output timing, as shown in FIG. 2A-FIG. 2D if the frequency of SCLK changes, the read data output (DOBANK [N:0]) will also change accordingly due to MCLK and PCLK changing with SCLK. In an effort to provide relatively fixed read latency across changes in the system clock frequency, additional compensation is used.

More particularly, as shown in FIG. 1, the DOBANK [N:0] signal is provided to the input of FF 112. The FF 112 is clocked by the DCLK signal to provide the data output (DOUT). The DCLK signal is generated by selecting one of the outputs of the FF chain that includes FF 113a-FF 113n using Mux 117. Each version is generated by clocking each of FF 113 with SCLK and using the RDEN signal at the beginning of the FF chain. As shown in FIG. 2A-FIG. 2D, by selecting the appropriate version of DCLK, the FF 112 may be clocked to correctly capture the DOBANK [N:0] signal and to output the DOUT [N:0] signal at a predetermined time after the RADD [M:0] signal is provided to the memory block 10 in increments of the SCLK period. By doing so, regardless of the SCLK frequency, a relatively fixed read data out (DOUT) latency may be achieved.

Figure 4:
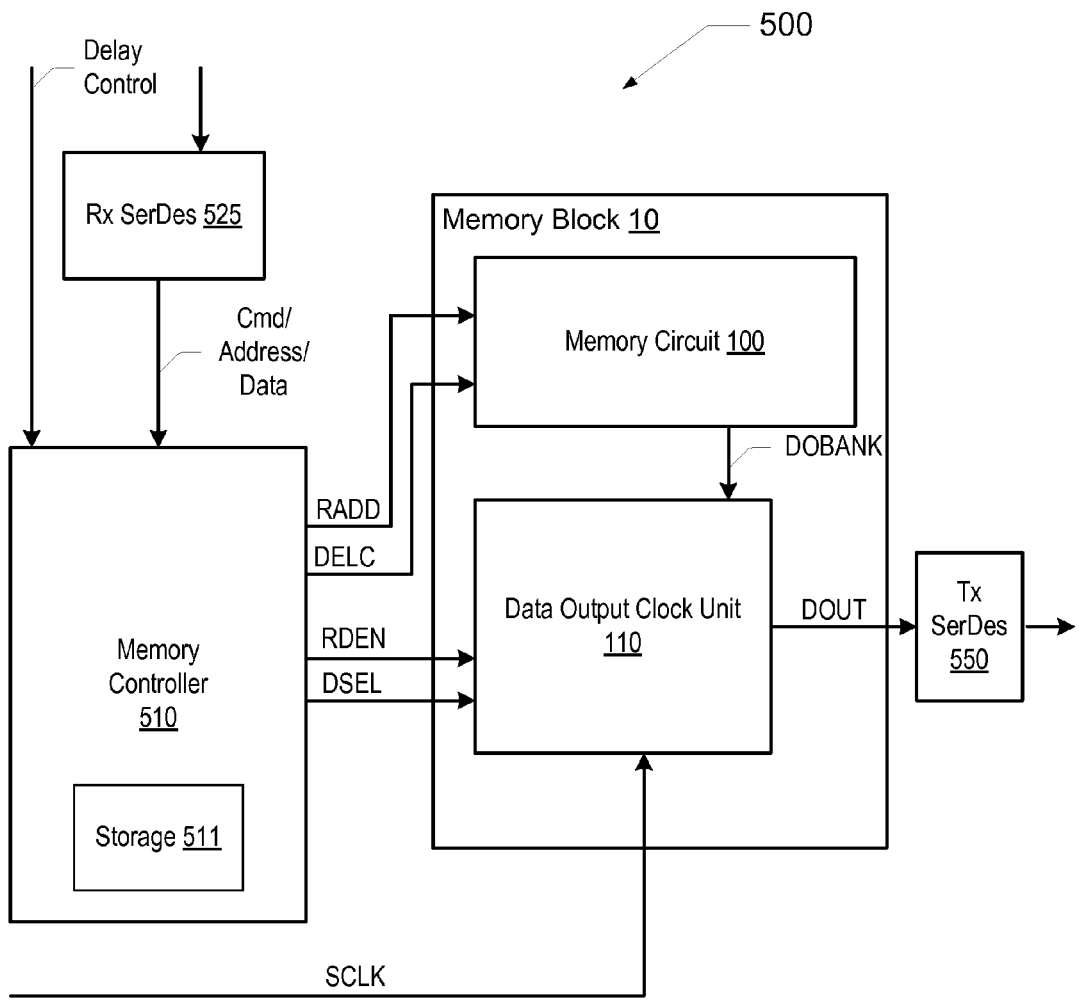
FIG. 4 is block diagram of one embodiment of a memory system including the memory block of FIG. 1.

Similar to the DELC signal, the Mux select signal DSEL may also be a multi-bit signal provided by a memory controller (shown in FIG. 4). In one embodiment, for a given SCLK frequency, a particular respective output of the FF chain may be selected. As described in greater detail below in conjunction with the description of FIG. 4, the memory controller may use a look-up table, configuration register, or other suitable configuration mechanism to select DCLK based upon the SCLK frequency.

It is noted that although devices have been designated as flip-flops in the above embodiment, it is contemplated that any type of clocked storage device (e.g., register, latch, etc.) may be used.

FIG. 2A through 2D illustrate timing diagrams of various embodiments of the memory block 10 shown in FIG. 1. More particularly, each timing diagram illustrates the timing of the memory block while operating with different combinations of system clock (SCLK) frequency and adjusted delay and output clock (DCLK) timing such that the read data output latency is relatively fixed for the different SCLK frequencies.

Figure 2A:
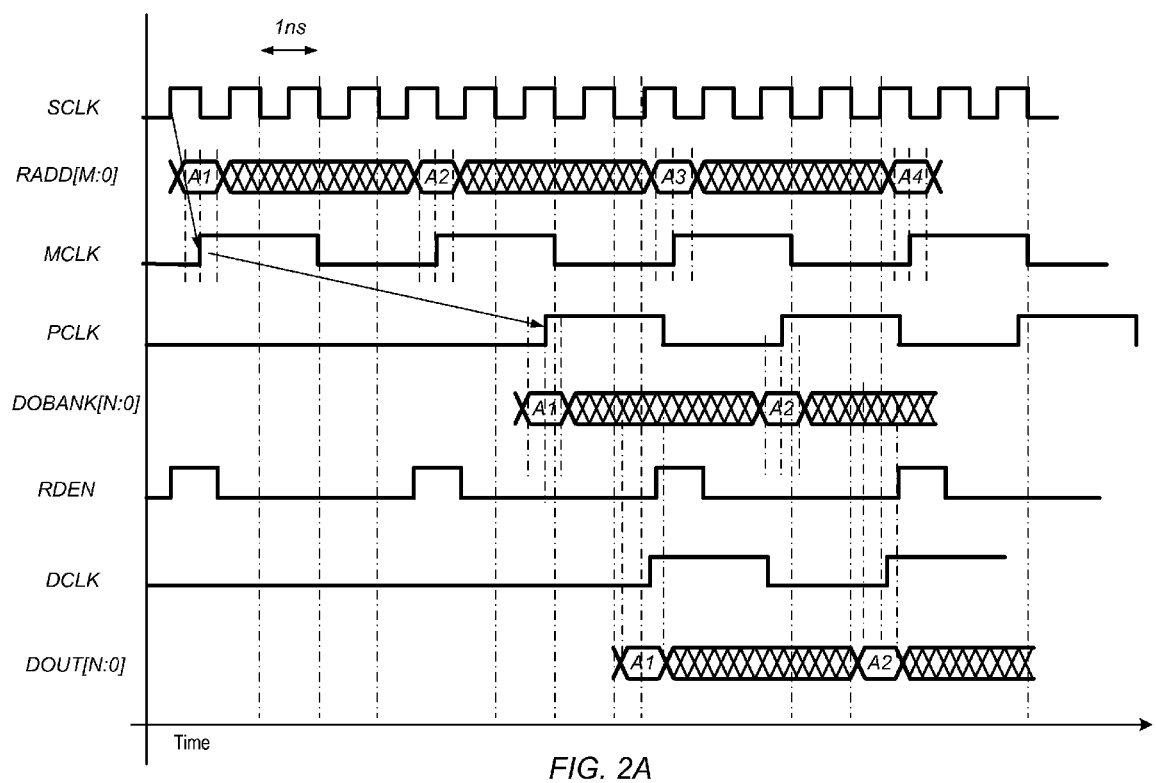
FIG. 2A is a timing diagram depicting the operational timing of one embodiment of the memory block of FIG. 1.

Referring to FIG. 2A, a timing diagram depicting the timing of one embodiment of the memory block shown in FIG. 1 is shown. The timing diagram illustrates several signals occurring in time beginning from left to right. More particularly, the system clock (SCLK) is the first signal on the top. The next signal is the read command/address signal (RADD [M:0]), followed by the memory clock signal (MCLK), which is followed by the pipeline clock signal PCLK. The read data (DOBANK [N:0]) output by the FF103 is shown next, followed by the read enable (RDEN) signal, and the data clock (DCLK), which is followed by the data out signal, (DOUT [N:0]).

As shown, the SCLK period is 1 ns, which corresponds to a 1 GHz frequency. This period corresponds to a system clock that may be used, for example, when a 10 G SerDes is implemented. As shown in FIG. 1, the leading edge of SCLK generates the MCLK signal (as shown by the arrow). In addition, as shown the SCLK signal is divided by four to create the MCLK signal. The RADD [M:0] signal is active during the first period of SCLK and every $4^{th}$ cycle representing a 250 MHz memory cycle. Accordingly the rising edge of MCLK causes the FF 101 to capture the RADD [M:0] signal and to provide the MADD [M:0] signal to the input of memory core 102. As described above, the adjustable delay unit 104 generates the PCLK signal from the MCLK signal (as shown by the arrow). Accordingly as shown in FIG. 2A, the PCLK signal is generated with an appropriate delay to capture the read data output from the memory core 102 and to provide that read data as the DOBANK [N:0] output. As shown, the first rising edge of PCLK occurs at approximately 6 ns. This represents the memory core latency or the memory core access time for this implementation.

In addition, as described above the DOBANK [N:0] signal is provided to the input of FF 112, which is clocked by the DCLK signal. The DCLK signal is selected from several versions of the DCLK, each triggered by a different rising edge of SCLK. In FIG. 2A, DCLK is aligned roughly with the 8$^{th}$ SCLK edge. Accordingly, the DOUT [N:0] signal is available approximately 8 ns after the RADD [M:0] signal is applied to the memory block 10. Thus, for a 250 MHz memory read cycle and an approximate memory core read latency of 6 ns, the memory block latency is approximately 8 ns.

Figure 2B:
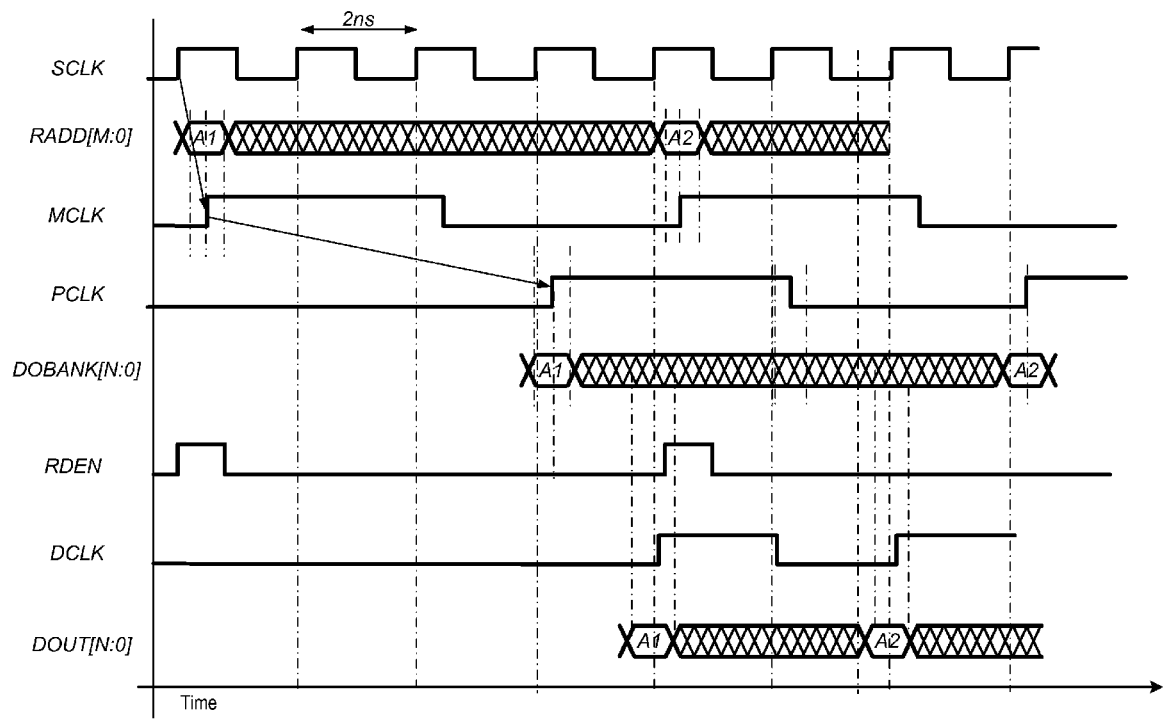
FIG. 2B is a timing diagram depicting the operational timing of another embodiment of the memory block of FIG. 1.

Referring to FIG. 2B, a timing diagram depicting the timing of another embodiment of the memory block shown in FIG. 1 is shown. The timing diagram in FIG. 2B is similar to the timing diagram shown in FIG. 2A. However, as shown in FIG. 2B, the SCLK period is 2 ns, which may correspond to a 500 MHz operating frequency. This period corresponds to a system clock that may be used, for example, when a 5G SerDes is implemented.

As shown, the MCLK signal is operating at a 1:4 ratio of SCLK, and thus the memory read cycle is 125 MHz. Accordingly, if the RADD [M:0] signal is captured and applied to the memory core 102 at the first rising edge of MCLK, approximately 6 ns later the PCLK signal captures the read data output by the memory core 102 within the FF 103, which provides the DOBANK [N:0] signal.

The first rising edge of the DCLK signal is selected to capture the DOBANK [N:0] signal while it is still available. As shown in FIG. 2B, a version of DCLK is selected so that the DOUT [N:0] signal occurs approximately 8 ns after the RADD [M:0] signal is applied to the memory block 10, which is approximately the same as the timing diagram in FIG. 2A. However, as shown in FIG. 2B, the DCLK signal is generated using only four SCLK edges instead of eight to obtain the 8 ns read data output latency.

Figure 2C:
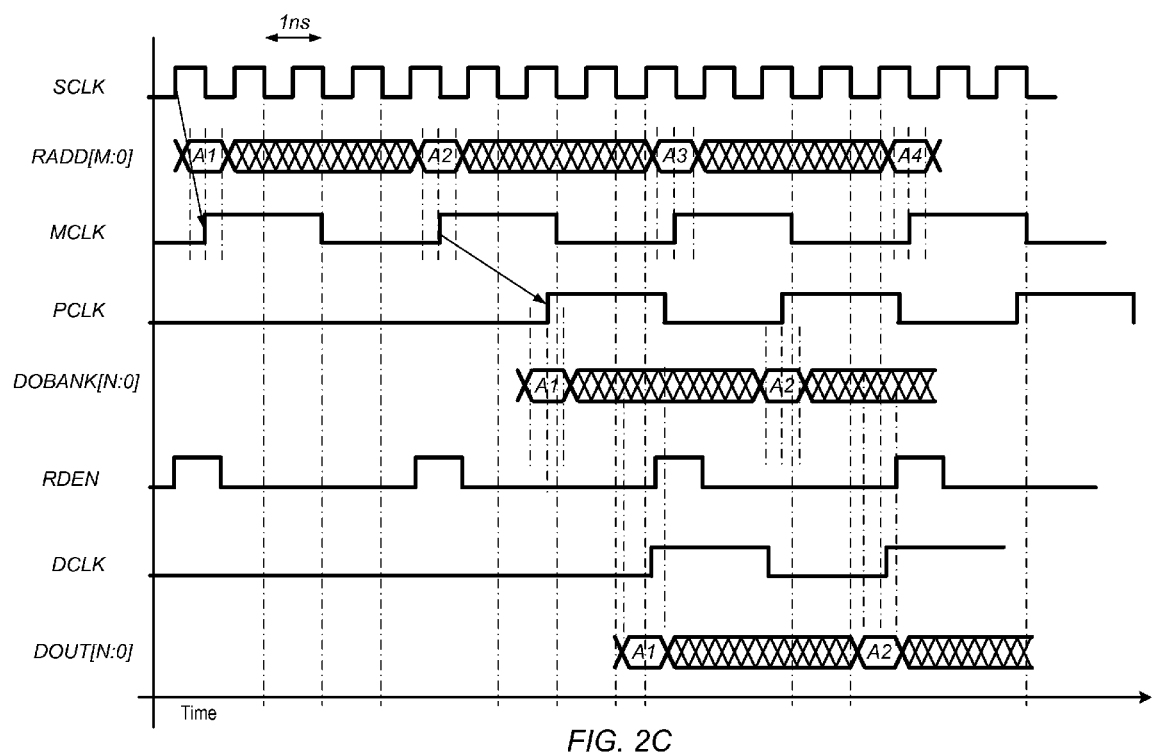
FIG. 2C is a timing diagram depicting the operational timing of another embodiment of the memory block of FIG. 1.

Turning to FIG. 2C, a timing diagram depicting the timing of another embodiment of the memory block shown in FIG. 1 is shown. The timing diagram in FIG. 2C is similar to the timing diagram shown in FIG. 2A. Specifically, the DCLK version is selected so that the DOUT [N:0] signal occurs approximately 8 ns (eight SCLK cycles) after the RADD [M:0] signal is applied to the memory block 10, which is approximately the same as the timing diagrams in FIG. 2A and FIG. 2B.

However, as shown by the arrow in FIG. 2C, the first rising edge of PCLK occurs in the second cycle of MCLK and is generated by the second rising edge of MCLK, whereas in FIG. 2A the first rising edge of PCLK is generated by the first rising edge of MCLK. In FIG. 2B, the first rising edge of PCLK occurs within the first cycle of MCLK and is generated by the first rising edge of MCLK. Accordingly, the adjustable delay unit 104 may be configured to adjust the delay of PCLK within a relatively wide window using more than one edge of MCLK to accommodate wide variations in memory core latency.

Figure 2D:
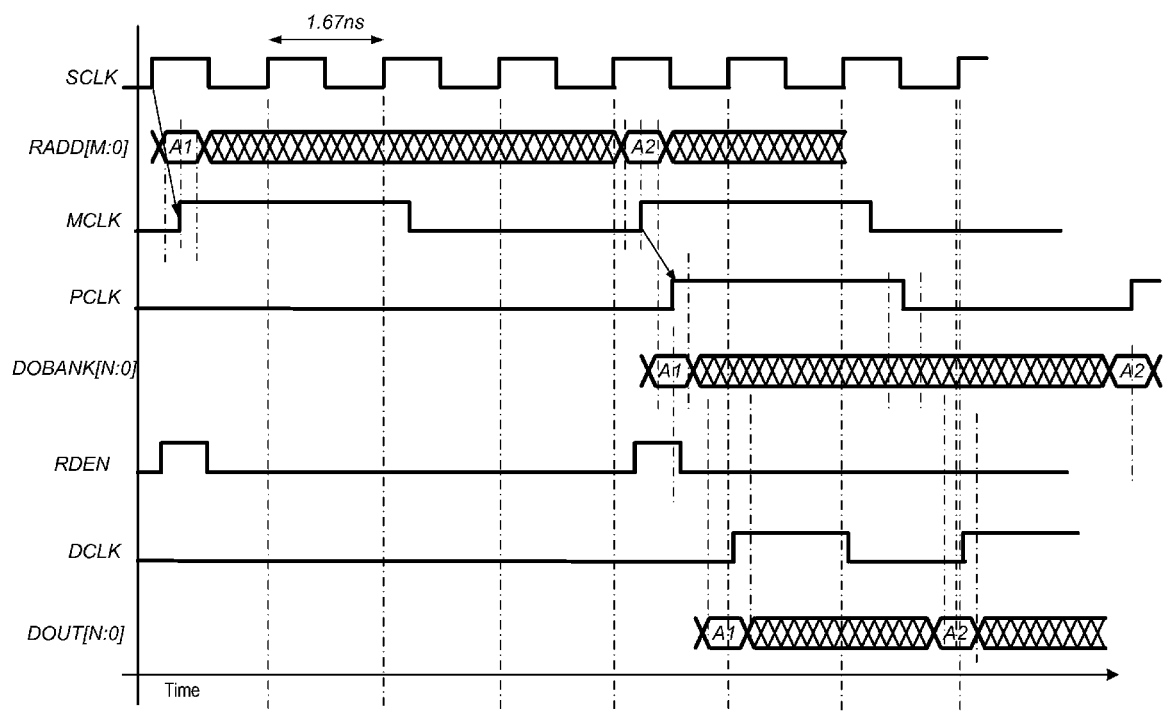
FIG. 2D is a timing diagram depicting the operational timing of another embodiment of the memory block of FIG. 1.

Referring to FIG. 2D, a timing diagram depicting the timing of yet another embodiment of the memory block shown in FIG. 1 is shown. The timing diagram in FIG. 2D is similar to the timing diagrams shown in FIG. 2C. However, the timing diagram of FIG. 2D includes an SCLK having a period of 1.67 ns, which corresponds to a 600 MHz operating frequency. This corresponds to a system clock that may be used, for example, when a 6G SerDes is implemented.

As shown, the MCLK signal is still operating at a 1:4 ratio of SCLK and thus has approximately a 150 MHz memory read cycle. However, in this implementation the MCLK period (6.7 ns) is longer than the latency of the memory core 102, which may be approximately 6 ns. Thus the MCLK to PCLK delay is kept small or at a minimum, otherwise the data would ready at the input of FF 103 and not being used. Accordingly, in FIG. 2D, at approximately 7.5 ns the PCLK signal captures the read data output by the memory core 102 within the FF 103, which provides the DOBANK [N:0] signal. This is in contrast to the delay from MCLK to PCLK shown in FIG. 2C which is bigger, since at the end of the MCLK cycle, the read data isn't available at the output of the memory core 102.

In FIG. 2D, the first rising edge of the DCLK signal is selected to capture the DOBANK [N:0] signal while it is still available. As shown in FIG. 2D, the DCLK version is selected so that the DOUT [N:0] signal occurs as close to 8 ns as possible, given the available SCLK edges. As shown, DOUT [N:0] appears approximately 8.33 ns after the RADD [M:0] signal is applied to the memory block 10, which is approximately the same latency as the timing diagrams in FIG. 2A through FIG. 2C. Accordingly, as shown in FIG. 2D, the DCLK signal is generated using only five SCLK edges instead of eight as in FIG. 2C, to obtain the 8.33 ns read data output latency.

Figure 3:
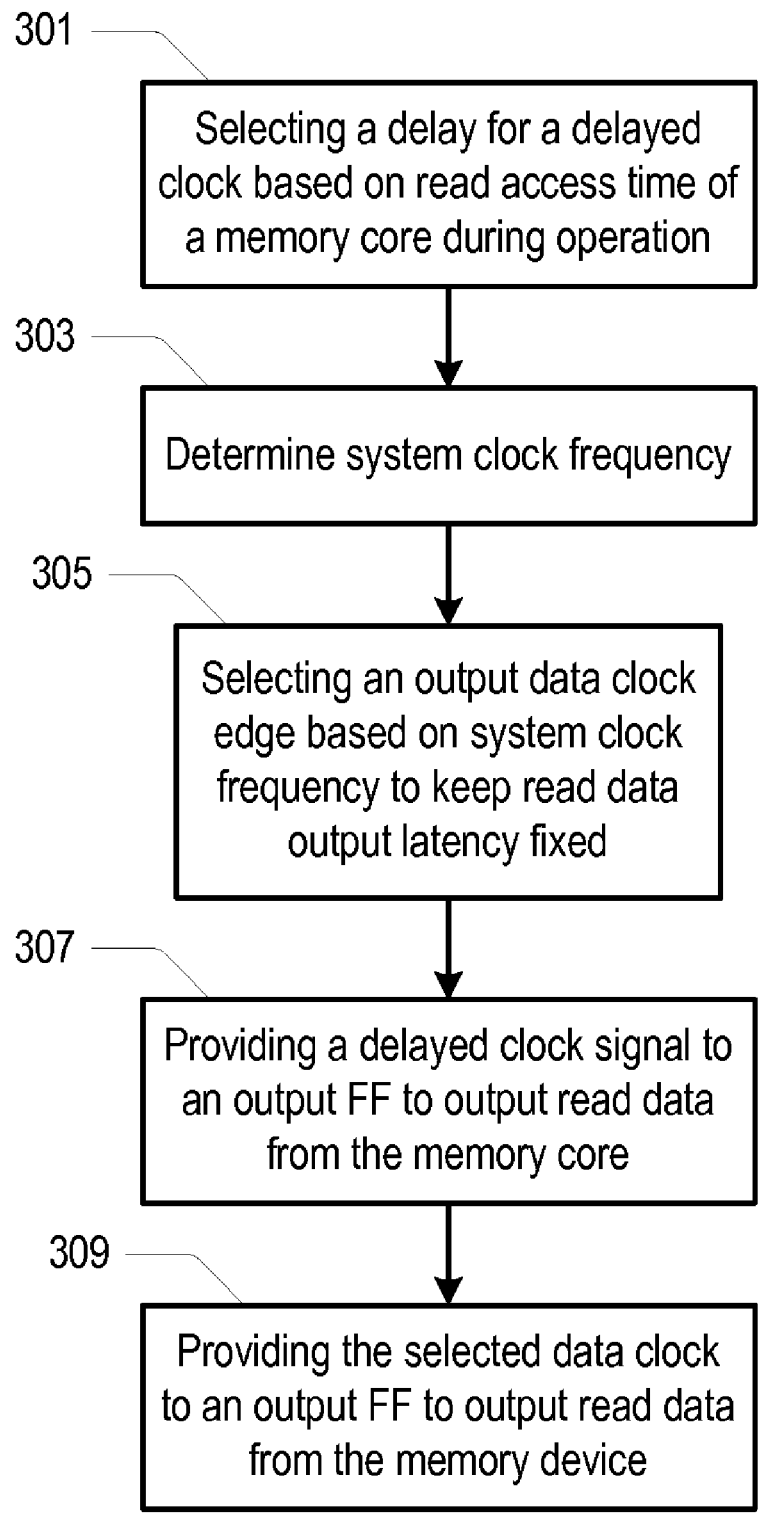
FIG. 3 is an operational flow diagram depicting the operation of one embodiment of the memory block shown in FIG. 1.

In FIG. 3, a flow diagram depicting the operation of one embodiment of the memory block of FIG. 1 is shown. Referring collectively to FIG. 1 through FIG. 3, and beginning in block 301 of FIG. 3, an appropriate delay is selected for the delayed version of MCLK (e.g., PCLK) based upon the read access time of memory core 102. In one embodiment, the system clock frequency is determined (block 303) and a corresponding data output clock is selected (block 305). More particularly, as described above, depending on the SCLK frequency a particular data output clock (DCLK) version is selected. Each version is clocked by a different edge of SCLK.

Accordingly, the delayed PCLK is provided to the output FF 103 to capture the read data from the memory core 102 (block 307). The selected version of the output data clock is provided to the output FF 112 to output the read data form the memory block 10. By doing so, the latency of the read data output becomes relatively fixed to a predetermined latency regardless of the SCLK frequency.

Referring to FIG. 4, a memory system including one embodiment of the memory block of FIG. 1 is shown. The memory system 500 includes a memory controller 510 coupled to receive delay control signals (e.g., DELC and DSEL), and commands, addresses, and data (e.g., RADD [M:0] and RDEN). As shown the RADD [M:0] and RDEN signals may be received via the receive (Rx) SerDes unit 525. In one embodiment, the delay control signals may be received via a separate interface such as a joint test action group (JTAG) interface, for example. The memory controller 510 is also coupled to the memory block 10, which is in turn coupled to the transmit (Tx) SerDes unit 550. It is noted that components that correspond to those shown in other figures have been numbered identically for clarity and simplicity.

In one embodiment, the memory block 10 may operate as described above in conjunction with the descriptions of FIG. 1 through FIG. 3. Accordingly, much of the description is omitted here for simplicity.

However, as shown in the illustrated embodiment of FIG. 4, the memory controller 510 includes a storage 511. In one embodiment, the storage 511 may be a register set, while in other embodiments, the storage 511 may be a memory such as memory from the RAM family, whether volatile or nonvolatile, or some type of read only memory (ROM) device. Accordingly, the lookup table may be programmed into the storage 511 in a variety of ways. For example, the storage 511 may be programmed at manufacture, or alternatively the storage 511 may be programmed during system initialization by a system BIOS, or during operation as part of a configuration space write.

In one embodiment, the storage may be configured to store clock information for the memory block 10. More particularly, the memory controller 510 may maintain a lookup table that includes several entries. Each entry may correspond to a particular frequency of SCLK, which may be dependent on the frequency of the SerDes units (e.g., 525 and 550). Thus, for each possible SCLK frequency the lookup table may hold a respective data clock select value. As described above, the data clock select value may be a multi-bit value that may be used by the memory controller 510 to generate the data clock select signal that is sent to the memory block 10. Accordingly, during start up, the memory controller may select the appropriate data clock select value based upon the SCLK frequency.

In addition, in one embodiment, the memory controller 510 is configured to generate the delay select signal that is used by the memory block 10 to adjust the delay of PCLK. In one embodiment, the memory controller 510 may also maintain clock information corresponding to the delay amount which corresponds to the memory access delay for the memory core of the memory circuit 100. For example, during initialization, the memory controller 510 may provide an in initial delay value to the memory block 10. This initial value may be sufficient to allow correct operation across a wide variation in processing, and operating temperature and voltage. However, in some cases, the access time for a particular memory core of a memory block may be different. Accordingly, as described above during operation such as BIST, the memory block may fail and need timing adjustment. In such an embodiment, the memory controller 510 may cooperatively and iteratively adjust the delay of PCLK until the timing is optimized. The memory controller 510 may maintain the values within storage 511.

Thus, by adjusting the delay of the pipeline clock (PCLK) to accommodate differences in memory core access times, and selecting an appropriate edge of the system clock (e.g., SCLK) for generating the output data clock (DCLK), the memory block 10 may provide a relatively fixed latency read data output even if the system clock frequency is changed.

It is noted that in one embodiment, memory system 500 may be a memory device implemented as system on a chip. In addition, the memory block 10 shown in FIG. 1 and FIG. 4 may be, for example, a single instantiation of a memory macro block from a design library. It is further noted that in other embodiments, there may be more memory blocks used, and those memory blocks may be multiplexed together, for example, to provide a data output.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory block comprising:
   a memory circuit including a memory core configured to output read data in response to receiving a read command;
   wherein the memory circuit is configured to output the read data from the memory core in response to being clocked by a clock signal having a selectable delay; wherein the delay is dependent upon a time taken for the read data to be output by the memory core after the read command is received at the memory block;
   a clock generation unit configured to capture the read data from the memory circuit and to cause the read data to be provided as an output of the memory block in response to being clocked by a selected version of a data clock signal;
   wherein the selected version of the data clock signal is selected from one of a plurality of clock edges generated by one of a plurality of clock edges of a system clock such that regardless of an operating frequency of the system clock, the read data is provided as the output of the memory block a predetermined amount of time after the read command is received at the memory block.

2. The memory block as recited in claim 1, wherein the clock signal operates at a frequency multiple of the system clock that is less than one.

3. The memory block as recited in claim 1, wherein the memory circuit is configured to delay the clock signal in response to receiving a delay select signal that selects the delay amount.

4. The memory block as recited in claim 1, wherein the delay select signal corresponds to a delay value which compensates for variations in the time for the read data to be output by the memory core after the read command is received at the memory block when the memory block is operated across process, voltage and temperature variations.

5. The memory block as recited in claim 1, wherein the memory circuit is configured to adjust the delay of the clock signal dynamically during operation of the memory block.

6. The memory block as recited in claim 1, wherein the clock generation unit is configured to select the one of a plurality of clock edges for the data output clock in response to receiving a data clock select signal.

7. The memory block as recited in claim 1, wherein the memory circuit is configured to select the one of a plurality of clock edges for the data output clock dynamically during operation of the memory block.

8. A method comprising:
   selecting an amount of time to delay a delayed clock signal based upon an amount of time for the read data to be output by a memory core after a read command is received at a memory block that includes the memory core;
   providing the delayed clock signal to an output clocked storage device to output read data from the memory core;
   providing a selectable version of a data clock signal to a second clocked storage device to capture the read data and causing the read data to be provided as an output of the memory block;
   selecting the data clock signal version from one of a plurality of clock edges generated by one of a plurality of clock edges of a system clock such that regardless of the an operating frequency of the system clock, the read data is provided to the output of the memory block a predetermined amount of time after the read command is received at the memory block.

9. The method as recited in claim 8, further comprising operating the clock signal at a frequency multiple of the system clock that is less than one.

10. The method as recited in claim 8, further comprising delaying the clock signal in response to receiving a delay select signal that selects the delay amount.

11. The method as recited in claim 8, wherein the delay select signal corresponds to a delay value which compensates for variations in the time for the read data to be output by the memory core after the read command is received at the memory block when the memory block is operated across process, voltage and temperature.

12. The method as recited in claim 8, further comprising adjusting the delay of the clock signal dynamically during operation of the memory block.

13. The method as recited in claim 8, further comprising selecting the one of a plurality of clock edges for the data output clock in response to receiving a data clock select signal.

14. The method as recited in claim 8, further comprising selecting the one of a plurality of clock edges for the data output clock during initialization of the memory block.

15. A system comprising:
a memory controller;
a memory block coupled to the memory controller, wherein the memory block includes:
  a memory circuit including a memory core configured to output read data in response to receiving a read command;
  wherein the memory circuit is configured to provide the read data from the memory core as an output in response to being clocked by a clock signal having a selectable delay; wherein the delay is dependent upon a time taken for the read data to be output by the memory core after the read command is received at the memory block;
  a clock generation unit configured to capture the read data from the memory circuit and to cause the read data to be provided as an output of the memory block in response to being clocked by a selected version of a data clock signal;
  wherein the selected version of the data clock signal is selected from one of a plurality of clock edges generated by one of a plurality of clock edges of a system clock such that regardless of an operating frequency of the system clock, the read data is provided as the output of the memory block a predetermined amount of time after the read command is received at the memory block.

16. The system as recited in claim 15, wherein the memory controller includes a storage configured to store clock configuration information, wherein the memory controller is configured to use the clock configuration information to generate clock select signals for selecting the version of the data clock signal.

17. The system as recited in claim 16, wherein the clock configuration information includes a lookup table having respective entries corresponding to different operating frequencies of the system clock, wherein each entry includes an encoding that corresponds to the clock select signals.

18. The system as recited in claim 15, wherein the memory controller is configured to generate initial clock delay select signals to select the amount of time that the clock signal is delayed based upon a predetermined configuration value.

19. The system as recited in claim 18, wherein the memory controller is configured to provide additional delay select signals to delay of the clock signal dynamically during operation of the memory block.

20. The system as recited in claim 15, wherein the clock signal corresponds to a delayed version of a memory clock signal that derived from and operates at a frequency multiple the system clock that is less than one.

21. A memory block comprising:
a memory circuit including:
  a memory core configured to output read data in response to receiving a read command;
  a first clocked storage device configured to capture and output the read data in response to being clocked by a clock signal;
  an adjustable delay unit configured to selectably provide the clock signal, wherein the clock signal is delayed by an amount of time that is dependent upon a time for the read data to be output by the memory core after the read command is received at the memory block;
a clock generation unit including a second clocked storage device configured to capture the read data from the first clocked storage device and to cause the read data to be provided as an output of the memory block in response to being clocked by a version of a data clock signal;
wherein the clock generation unit is configured to select a version of the data clock signal from one of a plurality of clock edges generated by one of a plurality of clock edges of a system clock;
wherein the selected data clock signal version is selected such that regardless of an operating frequency of the system clock, the read data is provided to the output of the memory block a predetermined amount of time after the read command is received at the memory block.

* * * * *